United States Patent
Kim et al.

(10) Patent No.: US 10,718,815 B2
(45) Date of Patent: Jul. 21, 2020

(54) METHOD AND APPARATUS FOR ESTIMATING STATE OF BATTERY BASED ON ERROR CORRECTION

(71) Applicant: SAMSUNG ELECTRONICS CO., LTD., Suwon-si (KR)

(72) Inventors: Jinho Kim, Yongin-si (KR); Tae Won Song, Yongin-si (KR); Sungick Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 275 days.

(21) Appl. No.: 15/637,269

(22) Filed: Jun. 29, 2017

(65) Prior Publication Data
US 2018/0143254 A1    May 24, 2018

(30) Foreign Application Priority Data
Nov. 22, 2016  (KR) .................. 10-2016-0155567

(51) Int. Cl.
| | | |
|---|---|---|
| *H02J 7/00* | (2006.01) | |
| *G01R 31/3842* | (2019.01) | |
| *G01R 31/367* | (2019.01) | |
| *G01R 31/392* | (2019.01) | |
| *G01R 31/36* | (2020.01) | |
| *H01M 10/44* | (2006.01) | |
| *H01M 10/48* | (2006.01) | |

(52) U.S. Cl.
CPC ....... *G01R 31/3842* (2019.01); *G01R 31/367* (2019.01); *G01R 31/3648* (2013.01); *G01R 31/392* (2019.01); *H01M 10/44* (2013.01); *H01M 10/48* (2013.01)

(58) Field of Classification Search
CPC .......................... G01R 31/3842; G01R 31/392
USPC ............................................... 320/134
See application file for complete search history.

(56) References Cited

U.S. PATENT DOCUMENTS

| | | | |
|---|---|---|---|
| 6,534,954 B1 | 3/2003 | Plett | |
| 2004/0263119 A1* | 12/2004 | Meyer .................. | H02J 7/0021 320/116 |
| 2011/0161025 A1 | 6/2011 | Tomura et al. | |
| 2012/0072144 A1* | 3/2012 | Zhang ................ | G01R 31/3828 702/63 |
| 2012/0109248 A1* | 5/2012 | Danielsson ........ | G01R 31/3835 607/29 |

(Continued)

FOREIGN PATENT DOCUMENTS

| | | |
|---|---|---|
| CN | 103149533 B | 3/2016 |
| JP | 2003-35755 A | 2/2003 |

(Continued)

OTHER PUBLICATIONS

Extended European Search Report dated May 2, 2018 in corresponding European Patent Application No. 17202719.5 (9 pages in English).

*Primary Examiner* — Suchin Parihar
(74) *Attorney, Agent, or Firm* — NSIP Law

(57) ABSTRACT

A method of estimating a state of a battery is disclosed. The method includes correcting electrical physical quantity information of the battery at a current time period using a correction value determined based on a voltage error of the battery from a previous time period, and determining state information of the battery based on the corrected electrical physical quantity information.

22 Claims, 13 Drawing Sheets

(56) References Cited

U.S. PATENT DOCUMENTS

| | | | |
|---|---|---|---|
| 2013/0297243 A1* | 11/2013 | Baba | H02J 7/044 |
| | | | 702/63 |
| 2015/0158395 A1 | 6/2015 | Li et al. | |
| 2015/0219726 A1 | 8/2015 | Lenz et al. | |
| 2015/0369868 A1 | 12/2015 | Greening et al. | |
| 2016/0054390 A1 | 2/2016 | Lin et al. | |
| 2017/0253140 A1* | 9/2017 | Chang | B60L 58/21 |
| 2018/0145527 A1* | 5/2018 | Ravi | H02J 7/0083 |
| 2018/0335479 A1* | 11/2018 | Hashimoto | G01R 31/3842 |

FOREIGN PATENT DOCUMENTS

| | | |
|---|---|---|
| JP | 2009-106027 A | 5/2009 |
| JP | 5406263 B2 | 2/2014 |
| JP | 2015-162991 A | 9/2015 |
| JP | 2015-215272 A | 12/2015 |
| KR | 10-2016-0049464 A | 5/2016 |
| WO | WO 2016/059126 A1 | 4/2016 |

\* cited by examiner

METHOD AND APPARATUS FOR ESTIMATING STATE OF BATTERY BASED ON ERROR CORRECTION

CROSS-REFERENCE TO RELATED APPLICATION(S)

This application claims the benefit under 35 USC § 119(a) of Korean Patent Application No. 10-2016-0155567 filed on Nov. 22, 2016, in the Korean Intellectual Property Office, the entire disclosure of which is incorporated herein by reference for all purposes.

BACKGROUND

1. Field

The following description relates to a method and apparatus to estimate a state of a battery.

2. Description of Related Art

A battery management system (BMS) estimates a state of a battery, for example, a state of charge (SoC) and a state of health (SoH), to assure an optimal operation of the battery. Particular electrical and electronic devices to which a battery is used may be diversified and expanded based on accuracy in estimating the SoC and the SoH. Thus, a BMS needs to accurately estimate a state of a battery.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there may be provided a method to estimate a state of a battery, the method including: correcting electrical physical quantity information of the battery at a current time period using a correction value determined based on a voltage error of the battery from a previous time period; and determining state information of the battery based on the corrected electrical physical quantity information.

The voltage error may be a difference between estimated voltage information of the battery from the previous time period and sensed voltage information of the battery from the previous time period.

The method may further include: determining the correction value using the voltage error and a capacity error determined based on estimated open-circuit voltage (OCV) information of the battery from the previous time period.

The determining of the correction value may include: applying a weight to the capacity error; and determining, to be the correction value, a value obtained by dividing the capacity error to which the weight may be applied by a constant value.

The weight may be determined based on an average current value calculated based on either one or both of current information at the current time period and current information from the previous time period.

The capacity error may be determined using a difference between first state information corresponding to a first OCV, which may be obtained by subtracting a partial value of the voltage error from the estimated OCV information, and second state information corresponding to a second OCV, which may be obtained by adding a remainder value of the voltage error to the estimated OCV information.

The method may further include: determining either one or both of a correction value to be used to correct discharging current information at the current time period and a correction value to be used to correct charging current information at the current time period based on an accumulated value of the discharging current information, an accumulated value of the charging current information, and a capacity error corresponding to the voltage error.

The method may further include: calculating an accumulated discharging current value and an accumulated charging current value based on current information at the current time period; determining current information to be corrected between discharging current information and charging current information by comparing the accumulated discharging current value and an absolute value of the accumulated charging current value; and determining a correction value for the determined current information, based on a ratio of the accumulated discharging current value and the absolute value of the accumulated charging current value, and on a capacity error corresponding to the voltage error.

The method may further include: calculating an accumulated discharging current value and an accumulated charging current value based on current information at the current time period; determining a correction value to discharge current information at the current time period, based on a ratio of the accumulated discharging current value and an absolute value of the accumulated charging current value, a capacity error corresponding to the voltage error, and a discharging correction ratio; and determining a correction value to charge current information at the current time period based on the ratio, the capacity error, and a charging correction ratio.

In accordance with a further embodiment, there is provided a method to correct an error in state information of a battery, the method including: receiving electrical physical quantity information of the battery at a current time period; determining a correction value using a capacity error corresponding to a voltage error of the battery from a previous time period; and correcting the electrical physical quantity information using the determined correction value.

The voltage error may be a difference between estimated voltage information of the battery from the previous time period and sensed voltage information of the battery from the previous time period.

The capacity error may be determined based on the voltage error and estimated open-circuit voltage (OCV) information of the battery from the previous time period.

The capacity error may be determined using a difference between first state information corresponding to a first OCV, which may be obtained by subtracting a partial value of the voltage error from the estimated OCV information from the previous time period, and second state information corresponding to a second OCV, which may be obtained by adding a remainder value of the voltage error to the estimated OCV information.

The determining of the correction value may include: adding a weight to the capacity error; and determining, to be the correction value, a value obtained by dividing the capacity error to which the weight may be added by a constant value.

The weight may be determined based on an average current value calculated based on either one or both of current information at the current time period and current information from the previous time period.

The determining of the correction value may include: determining either one or both of a correction value to be used to correct discharging current information at the current time period and a correction value to be used to correct charging current information at the current time period based on an accumulated value of the discharging current information, an accumulated value of the charging current information, and the capacity error corresponding to the voltage error.

The determining of the correction value may include: calculating an accumulated discharging current value and an accumulated charging current value based on current information at the current time period; determining current information to be corrected between discharging current information and charging current information by comparing the accumulated discharging current value and an absolute value of the accumulated charging current value; and determining a correction value for the determined current information based on a ratio of the accumulated discharging current value and the absolute value of the accumulated charging current value and on the capacity error.

The determining of the correction value may include: calculating an accumulated discharging current value and an accumulated charging current value based on current information at the current time period; determining a correction value for discharging current information at the current time period based on a ratio of the accumulated discharging current value and an absolute value of the accumulated charging current value, the capacity error, and a discharging correction ratio; and determining a correction value for charging current information at the current time period based on the ratio, the capacity error, and a charging correction ratio.

In accordance with an embodiment, there is provided a non-transitory computer-readable storage medium storing instructions that, when executed by a processor, cause the processor to perform the method described above.

In accordance with a further embodiment, there is provided an apparatus to estimate a state of a battery, the apparatus including: a controller configured to correct electrical physical quantity information of the battery at a current time period using a correction value determined based on a voltage error of the battery from a previous time period, and determine state information of the battery based on the corrected electrical physical quantity information; and a memory configured to store instructions associated with an operation of the controller.

The controller may be configured to determine the correction value using the voltage error and a capacity error determined based on estimated open-circuit voltage (OCV) information of the battery from the previous time period.

The controller may be configured to apply a weight to the capacity error and determine, to be the correction value, a value obtained by dividing the capacity error to which the weight may be added by a time value corresponding to the current time period.

The capacity error may be determined using a difference between first state information corresponding to a first OCV obtained by subtracting a partial value of the voltage error from the estimated OCV information, and second state information corresponding to a second OCV obtained by adding a remainder value of the voltage error to the estimated OCV information.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
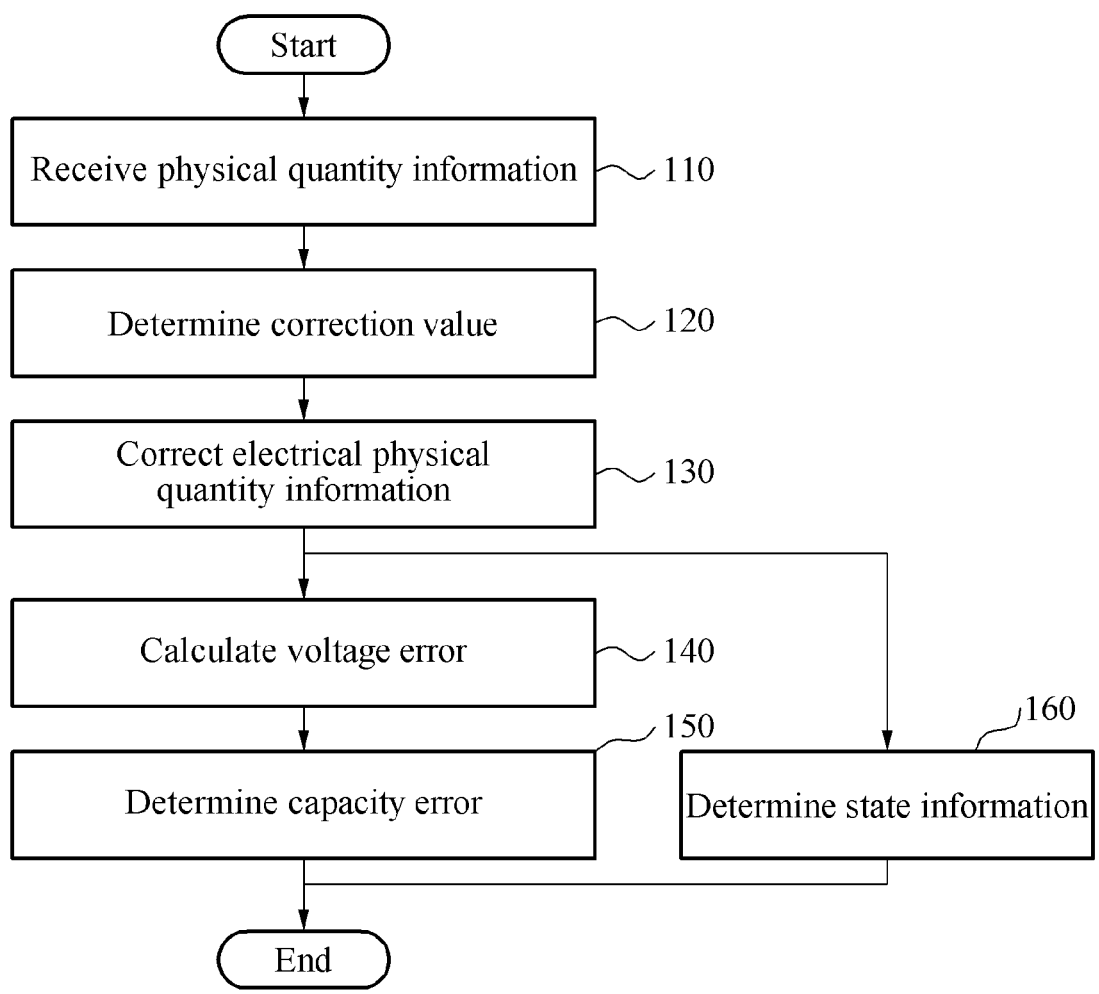
FIG. 1 is a flowchart illustrating an example of a method of an apparatus to estimate a state of a battery.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Terms such as first, second, A, B, (a), (b), and the like may be used herein to describe components. Each of these terminologies is not used to define an essence, order or sequence of a corresponding component but used merely to distinguish the corresponding component from other component(s). For example, a first component may be referred to a second component, and similarly the second component may also be referred to as the first component.

It should be noted that if it is described in the specification that one component is "connected," "coupled," or "joined" to another component, a third component may be "connected," "coupled," and "joined" between the first and second components, although the first component may be directly connected, coupled or joined to the second component. In addition, it should be noted that if it is described in the specification that one component is "directly connected" or "directly joined" to another component, a third component may not be present therebetween. Likewise, expressions, for example, "between" and "immediately between" and "adjacent to" and "immediately adjacent to" may also be construed as described in the foregoing.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

FIG. 1 is a flowchart illustrating an example of a method of an apparatus to estimate a state of a battery. The apparatus to estimate a state of a battery is hereinafter simply referred to as a battery state estimating apparatus.

The battery state estimating apparatus is assumed to operate in a current period, for example, an $N^{th}$ period.

Referring to FIG. 1, in operation 110, the battery state estimating apparatus receives physical quantity information of a battery. The battery is, for example, a battery cell, a battery module, and a battery pack. The physical quantity information used herein includes one of electrical physical quantity information of the battery, for example, voltage information and current information, and thermal physical quantity information of the battery, for example, temperature information, or a combination of the voltage, current, and thermal physical quantity information.

The voltage information, the current information, and the temperature information are alternatively referred to as a voltage profile, a current profile, and a temperature profile, respectively.

The battery state estimating apparatus receives the physical quantity information of the battery from a sensing system including a single sensor or a group of sensors. The battery state estimating apparatus collects the physical quantity information of the battery using the sensing system. The sensing system includes, for example, one of a voltage sensor, a current sensor, and a temperature sensor, or a combination thereof. However, the sensing system is not limited to the examples described in the foregoing.

In operation 120, the battery state estimating apparatus determines a correction value. In one example, the battery state estimating apparatus determines a correction value to be used to correct current information from a current time period, for example, an $N^{th}$ period, based on a voltage error from a previous time period, for example, an $N-1^{th}$ period. For purposes of brevity, from this point forward, a current time period is referred to as a current period and a previous time period is referred to as a previous period. Similarly, a first time period is referred a first period and a second time period is referred to as a second period. Also, an $N-1^{th}$ time period is referred to as an $N-1^{th}$ period and an $N^{th}$ time period is referred to as $N^{th}$ period.

The determining of the correction value for the current information will be described in detail with reference to FIG. 3. In another example, the battery state estimating apparatus determines at least one of a correction value to be used to correct discharging current information at the current period or a correction value to be used to correct charging current information at the current period based on an accumulated value of the discharging current information, an accumulated value of the charging current information, and a capacity error corresponding to the voltage error. The determining of the correction value for the charging current information and/or the discharging current information will be described in detail with reference to FIGS. 4A and 4B, and 5A and 5B.

In operation 130, the battery state estimating apparatus corrects electrical physical quantity information. The battery state estimating apparatus corrects the current information at the current period using the determined correction value. For example, in a case that a correction value is $I_{correct}$ and the current information at the current period is I, the battery state estimating apparatus adds $I_{correct}$ to I to generate corrected current information $I+I_{correct}$.

In operation 160, the battery state estimating apparatus determines state information of the battery. For example, the battery state estimating apparatus determines the state information of the battery based on the corrected electrical physical quantity information and/or temperature information. The state information includes, for example, a state of charge (SoC) and a state of health (SoH). In one example, the battery state estimating apparatus determines the state information of the battery through a battery model. For example, the corrected current information and/or the temperature information are/is input to the battery model, and values associated with a current state, charge, or condition of the battery, for example, an SoC of the battery, are calculated based on the battery model.

The battery model is modeled after characteristics, for example, voltage, current, and temperature, of the battery. The battery model may be, for example, an electric circuit that is modeled after an input characteristic and an output characteristic of the battery through a configuration of an electric circuit, or an electrochemical model that is modeled after characteristics of chemical reactions occurring inside the battery. However, the battery model is not limited to the example models described in the foregoing.

The battery model is stored in the battery state estimating apparatus. However, the battery model is not necessarily stored in the battery state estimating apparatus, but may be stored in a memory disposed outside the battery state estimating apparatus.

In operation 140, the battery state estimating apparatus calculates the voltage error. The battery state estimating apparatus calculates the voltage error based on voltage information from the current period and estimated voltage information. For example, the battery state estimating apparatus calculates the voltage error denoted as $\Delta V$ herein based on Equation 1.

$$\Delta V = V_{sensed} - V_{estimated} \qquad \text{[Equation 1]}$$

In Equation 1, $V_{sensed}$ denotes voltage information indicating a voltage of a battery sensed or measured in a current period. $V_{estimated}$ denotes estimated voltage information indicating an estimated voltage of the battery from the current period. The estimated voltage information $V_{estimated}$ may be determined by the battery model. For example, the battery model receives the physical quantity information, for example, the corrected current information and/or the temperature information, and determines the estimated voltage information $V_{estimated}$ based on the received physical quantity information.

In operation 150, the battery state estimating apparatus determines a capacity error based on the voltage error. In one example, the battery state estimating apparatus determines the capacity error using the voltage error and estimated open-circuit voltage (OCV) information of the battery. The estimated OCV information indicates an OCV of the battery estimated in the current period. The estimated OCV information is determined by the battery model. For example, the battery model receives the physical quantity information, for example, the corrected current information and/or the temperature information, and determines the estimated OCV information of the battery based on the received physical quantity information.

The battery state estimating apparatus determines a first OCV obtained by subtracting a partial value of the voltage error from the estimated OCV information, and a second OCV obtained by adding a remainder value of the voltage error to the estimated OCV information. For example, the battery state estimating apparatus determines the first OCV and the second OCV based on Equation 2.

First OCV=estimated OCV−α

Second OCV=estimated OCV+β

$$\alpha+\beta=\Delta V \qquad \text{[Equation 2]}$$

In Equation 2, estimated OCV denotes estimated OCV information. In one example, a value of α and a value of β are equal to each other as $\Delta V/2$. Alternatively, the value of α and the value of β are different from each other.

The battery state estimating apparatus determines first state information corresponding to the first OCV and second state information corresponding to the second OCV by referring to predefined corresponding information. The corresponding information includes an OCV-SoC lookup table or an OCV-SoC curve. Table 1 illustrates an example of the OCV-SoC lookup table. However, the OCV-SoC lookup table is not limited to the example illustrated in Table 1 below.

TABLE 1

| SoC (%) | OCV (V) |
|---|---|
| 100 | 4.3221 |
| 95 | 4.1052 |
| 90 | 3.9864 |
| 85 | 3.9761 |
| 80 | 3.9654 |
| 75 | 3.9543 |
| 70 | 3.9501 |
| 65 | 3.9415 |
| 60 | 3.9354 |
| 55 | 3.9302 |
| ... | ... |

The battery state estimating apparatus determines the capacity error based on a difference between the first state information and the second state information. For example, the battery state estimating apparatus determines the capacity error based on Equation 3.

$$\Delta capacity=\Delta SoC \times capacity \qquad \text{[Equation 3]}$$

In Equation 3, $\Delta SoC$ denotes a difference between first state information and second state information. In Equation 3, capacity and $\Delta capacity$ denote a capacity of a battery and a capacity error, respectively.

A capacity error, $\Delta capacity$, from a current period is used to determine a correction value to be used to correct electrical physical quantity information from a subsequent period, for example, an $N+1^{th}$ period.

Figure 2:
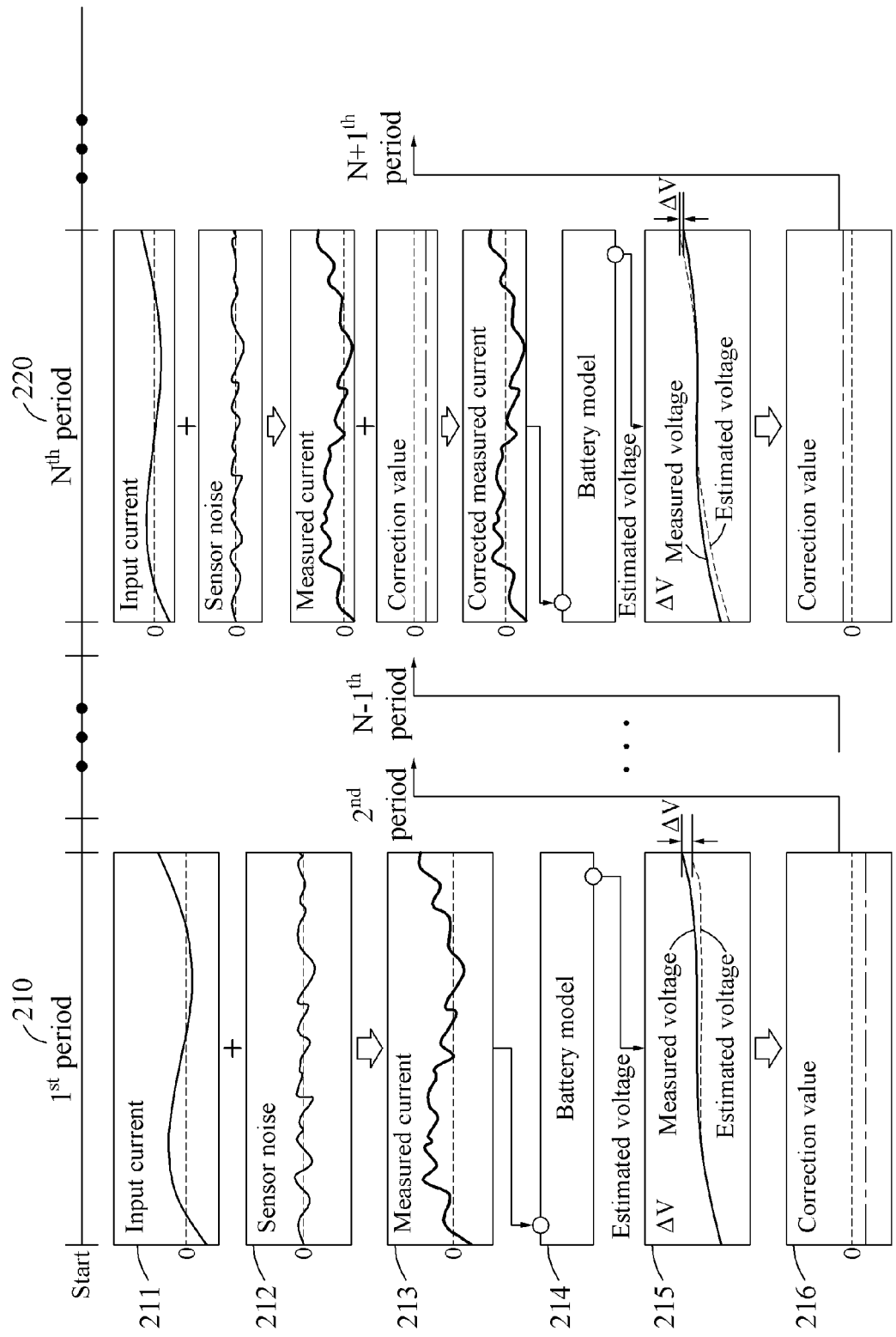
FIG. 2 is a diagram illustrating an example of an operation of an apparatus to estimate a state of a battery in a time period.

FIG. 2 is a diagram illustrating an example of an operation of a battery state estimating apparatus in a time period.

A left portion of the example of FIG. 2 illustrates a graph 211 of an input current in a first time period or a first period 210. The input current indicates a current, for example, a charging current or a discharging current, of a battery in the first period 210.

A current sensor may have sensor noise, which is illustrated in a graph 212. Thus, measured current information of the current sensor may include the sensor noise. The measured current information is illustrated in a graph 213. In the graph 213, the sensor noise affecting the input current of the graph 211 is shown. The measured current information may correspond to the current information described with reference to FIG. 1.

Referring to FIG. 2, a battery state estimating apparatus receives the measured current information from the current sensor. Although not illustrated in FIG. 2, the battery state estimating apparatus receives measured voltage information from a voltage sensor, and measured temperature information from a temperature sensor. The measured voltage information corresponds to the voltage information $V_{sensed}$ described with reference to FIG. 1, and the measured temperature information corresponds to the temperature information described with reference to FIG. 1.

The battery state estimating apparatus inputs the measured current information to a battery model 214. Although not illustrated in FIG. 2, the battery state estimating apparatus inputs the measured temperature information to the battery model 214. The battery model 214 determines state information of the battery at the first period 210 based on at least one of the measured current information or the measured temperature information. In addition, the battery model 214 estimates a voltage of the battery at the first period 210 based on at least one of the measured current information or the measured temperature information. That is, the battery state estimating apparatus determines estimated voltage information at the first period 210.

A graph 215 shows the measured voltage information and the estimated voltage information. As described above, due to an error of the battery model 214, the measured voltage information and the estimated voltage information differ from each other.

The battery state estimating apparatus determines a voltage error $\Delta V$ at the first period 210 by calculating a difference between the measured voltage information and the estimated voltage information. As illustrated in FIG. 2, the battery state estimating apparatus determines the voltage error $\Delta V$ at the first period 210 by calculating a difference between a last value of the measured voltage information from the first period 210 and a last value of the estimated voltage information at the first period 210. Based on an example, the battery state estimating apparatus determines the voltage error $\Delta V$ to be an average value of the measured voltage information and the estimated voltage information, or an absolute value of the measured voltage information and the estimated voltage information, at the first period 210. The description provided in the foregoing is an example of the determining of the voltage error $\Delta V$. Therefore, the determination conducted by the battery state estimating apparatus of the voltage error ΔV is not limited to the description provided in the foregoing.

The battery state estimating apparatus determines a correction value to be used to correct a measured current from a subsequent period, for example, a second period, based on the voltage error ΔV. The determining of the correction value is described hereinafter.

The correction value determined from the first period 210 is illustrated in a graph 216.

In an example, it is assumed that an $N^{th}$ period 220 has begun. The battery state estimating apparatus receives measured current information from the $N^{th}$ period 220.

The battery state estimating apparatus corrects the measured current information at the $N^{th}$ period 220 using a correction value determined based on a voltage error from a previous period, an $N-1^{th}$ period. The battery state estimating apparatus inputs the corrected measured current information and/or measured temperature information to the battery model. The battery model determines state information of the battery from the $N^{th}$ period 220 based on the corrected measured current information and/or the measured temperature information.

The descriptions provided with reference to FIG. 1 may be applicable to the descriptions provided with reference to FIG. 2, and thus a more detailed and repeated description is omitted here for brevity.

Figure 3:
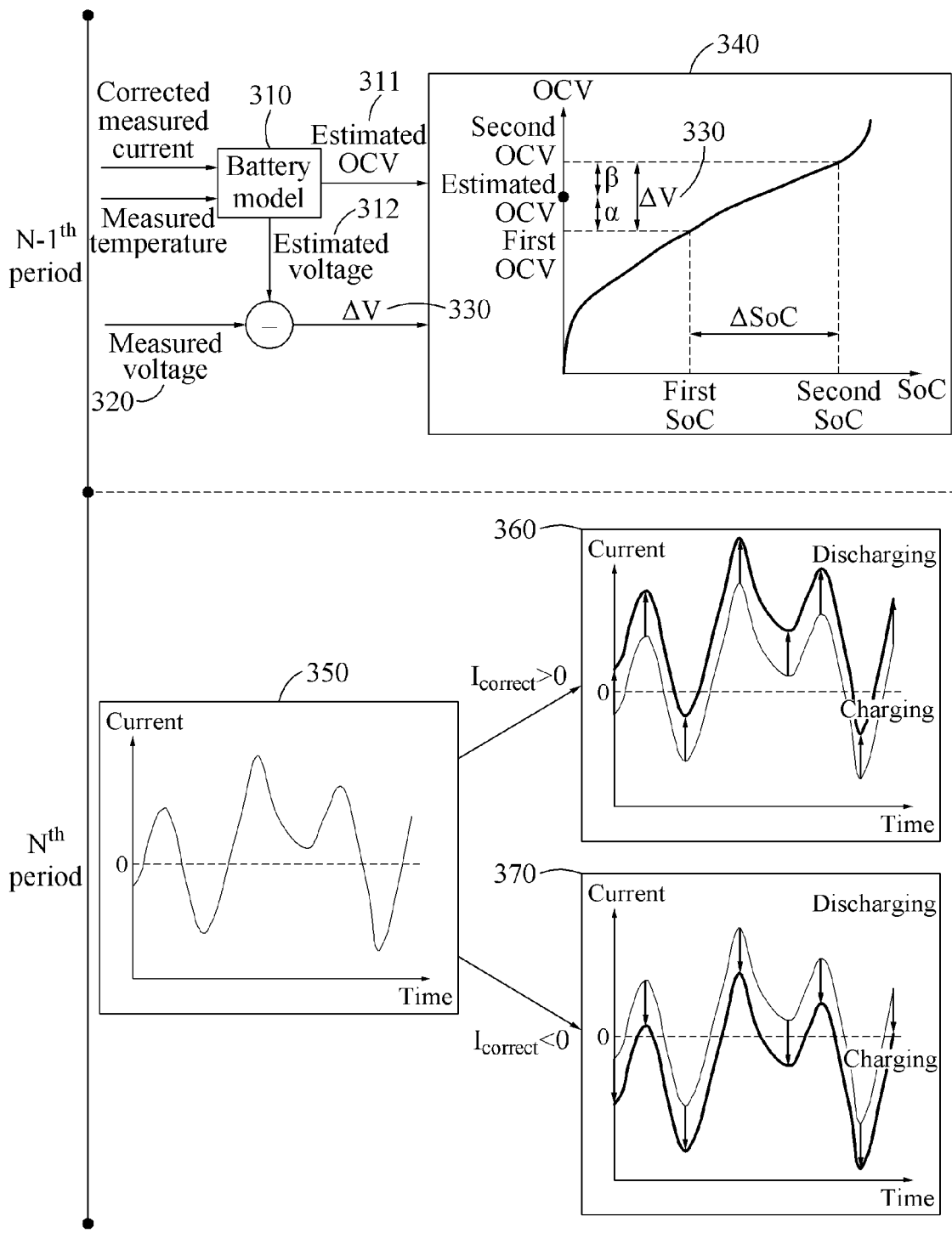
FIG. 3 is a diagram illustrating an example of a process to determine a correction value for current information.

FIG. 3 is a diagram illustrating an example of a process to determine a correction value for current information.

Referring to FIG. 3, a correction value to be used to correct measured current information from an $N^{th}$ period is determined based on ΔV 330 and estimated OCV information 311 from an $N-1^{th}$ period. The determining of the correction value will be described in detail hereinafter.

A battery model 310 receives corrected measured current information and measured temperature information at the $N-1^{th}$ period. The battery model 310 determines the estimated OCV information 311 and estimated voltage information 312 at the $N-1^{th}$ period based on at least one of the corrected measured current information from the $N-1^{th}$ period or the measured temperature information from the $N-1^{th}$ period.

A battery state estimating apparatus determines ΔV 330 using the measured voltage information 320 from the $N-1^{th}$ period and the estimated voltage information 312 from the $N-1^{th}$ period.

The battery state estimating apparatus determines a first OCV and a second OCV based on the estimated OCV information 311 and ΔV 330. In an example, the first OCV is a value obtained by subtracting a partial value, for example, α, of ΔV 330 from the estimated OCV information 311. The second OCV is a value obtained by adding a remainder value, for example, β, of ΔV 330 to the estimated OCV information 311.

The battery state estimating apparatus determines a first SoC corresponding to the first OCV and a second SoC corresponding to the second OCV by referring to an OCV-SoC curve 340. When the first SoC and the second SoC are determined, the battery state estimating apparatus calculates a ΔSoC, which is a value obtained by subtracting the first SoC from the second SoC, for example, ΔSoC=second SoC−first SoC.

The battery state estimating apparatus calculates a capacity error Δcapacity from the $N-1^{th}$ period by multiplying ΔSoC and a capacity of the battery. The battery state estimating apparatus stores Δcapacity in a memory or a buffer.

When the $N^{th}$ period starts, a current sensor senses or measures a current of the battery. The battery state estimating apparatus collects current information 350 at the $N^{th}$ period. The current information at the $N^{th}$ period is illustrated in a graph 350.

The battery state estimating apparatus determines a capacity Δcapacity_N to be corrected from the $N^{th}$ period based on Δcapacity. In one example, the battery state estimating apparatus determines Δcapacity_N by applying a weight to Δcapacity. For example, the battery state estimating apparatus may determine Δcapacity_N based on Equation 4.

$$\Delta capacity\_N = \Delta capacity \times w \qquad \text{[Equation 4]}$$

In Equation 4, w denotes a weight. The weight is determined based on an average current value calculated based on at least one of current information at a current period or current information from a previous period. In response to a great average current value, a small weight is determined. In response to the great average current value, an error occurs due to a correction value when the current information from the $N^{th}$ period is corrected using the correction value and, thus, the small weight is determined. Conversely, in response to a small average current value, a large or a heavy weight is determined. In response to the small average current value, an error does not occur due to a correction value when the current information from the $N^{th}$ period is corrected using the correction value and, thus, the large or the heavy weight is determined. The determining of the weight will be described in detail hereinafter.

The battery state estimating apparatus calculates the average current value. The average current value is, for example, an average value of an absolute value of the current information from the $N^{th}$ period, an average value of the current information from the $N^{th}$ period, or an average movement value of current information from most recent m periods including the $N^{th}$ period. The battery state estimating apparatus determines the weight based on the average current value. For example, in response to the average current value being greater than or equal to a preset reference value, for example, 1 C-rate, the battery state estimating apparatus determines the weight to be 0.1 (w=0.1). Conversely, in response to the average current value being less than the reference value, the battery state estimating apparatus determines the weight to be 0.01 (w=0.01). The values of the weight are provided as mere examples and, thus, a value of the weight is not limited to such examples. In another example, the battery state estimating apparatus determines the weight by referring to corresponding information indicating a relationship between a current value and a value of the weight. The corresponding information includes a table or a function associated with the relationship between the current value and the weight. Table 2 illustrates an example of the table associated with the relationship between the current value and the weight. However, the current value and the weight are not limited to the example illustrated in Table 2.

TABLE 2

| C-rate | w |
|---|---|
| 0.01 | 0.3 |
| 0.1 | 0.2 |
| 0.5 | 0.1 |
| 1 | 0.05 |
| 2 | 0.01 |
| 3 | 0.005 |
| 5 | 0.001 |

Referring to Table 2, in a case that the average current value is calculated to be 0.1 C-rate, the battery state estimating apparatus determines the weight to be 0.2 (w=0.2).

The value of Δcapacity_N calculated based on Equation 4 may be a positive number or a negative number. The value of Δcapacity_N being a positive number indicates that an actual discharging capacity of a battery is not applied to state information of the battery due to sensor noise and/or an error of a battery model. Although described hereinafter, the battery state estimating apparatus corrects current information by a correction value corresponding to Δcapacity_N so that the actual discharging capacity is applied to the state information. In addition, the value of Δcapacity_N being a negative number indicates that an actual charging capacity of a battery is not applied to state information of the battery due to sensor noise and/or an error of a battery model. Although described hereinafter, the battery state estimating apparatus corrects current information by a correction value corresponding to Δcapacity_N so that the actual charging capacity is applied to the state information.

The battery state estimating apparatus determines a value obtained by dividing Δcapacity_N by a constant value to be a correction value. The constant value, which is an updated period of the state information, is a length of the $N^{th}$ period. For example, the constant value may be 100 milliseconds (ms). However, the constant value is not limited to the example value, and also may be modified.

Dissimilar to the example of FIG. 2, in the example of FIG. 3, the correction value is determined at a current period, for example, the $N^{th}$ period. In the example of FIG. 2, the correction value is determined from a previous period, for example, the $N-1^{th}$ period.

The battery state estimating apparatus corrects the current information 350 from the $N^{th}$ period using the correction value. As described above, the battery state estimating apparatus adds the correction value to the current information 350.

An example 360 of the corrected current information is also illustrated in FIG. 3. A bold solid line indicates the corrected current information. In response to the value of Δcapacity_N being a positive number, that is, the correction value being a positive number, current information at a current period is shifted upwards by the correction value. Thus, a number of pieces of current information indicating a value greater than 0 increases after the correction, and a discharging capacity is reflected in state information at the current period.

Another example 370 of the corrected current information is also illustrated in FIG. 3. A bold solid line indicates the corrected current information. In response to the value of Δcapacity_N being a negative number, that is, the correction value being a negative number, current information at the current period is shifted downwards by the correction value. Thus, a number of pieces of current information indicating a value less than 0 increases after the correction, and a charging capacity is reflected in the state information at the current period.

The C-rate may represent a of measure used to set a current value under various use conditions during charging of a battery, and to predict or mark a period of time during which a battery is available. For example, the C-rate is denoted as C, and is defined as "(Charge current)/(Battery capacity)." In an example, a C-rate of 1 C corresponds to an amount of charge used to charge a battery for one hour.

FIGS. 4A and 4B, and 5A and 5B are diagrams illustrating examples of a process to determine a correction value to charge current information and/or discharge current information.

Referring to FIGS. 4A and 4B, and 5A and 5B, a battery state estimating apparatus determines a correction value to charge current information and/or discharge current information. A process of determining the correction value will be described hereinafter with reference to FIGS. 4A and 4B, and 5A and 5B.

Figure 4A:
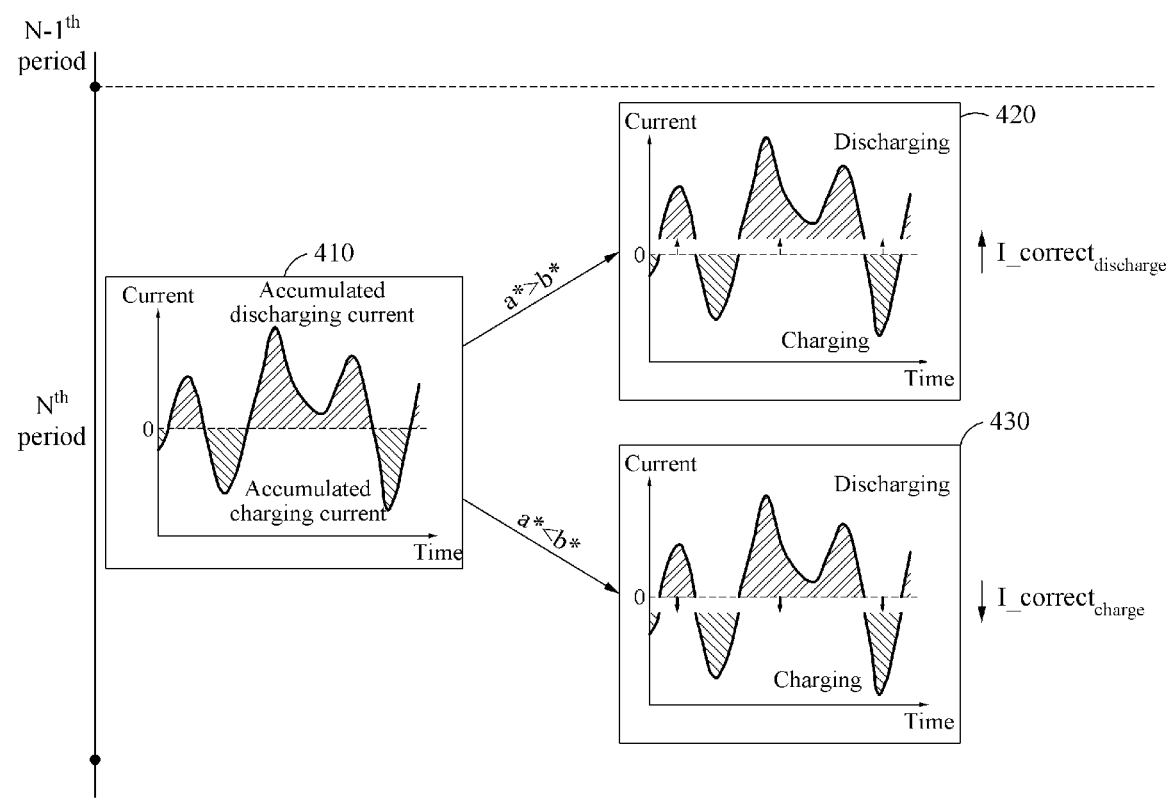
FIGS. 4A and 4B, and 5A and 5B are diagrams illustrating examples of a process to determine a correction value to charge current information and/or discharge current information.

Referring to FIG. 4A, the battery state estimating apparatus determines Δcapacity_N at an $N^{th}$ period. The determining of Δcapacity_N is described above and, thus, a more detailed and repeated description will be omitted here for brevity.

The battery state estimating apparatus calculates an accumulated discharging current value and an accumulated charging current value at the $N^{th}$ period. The accumulated discharging current value refers to an accumulated value of discharging current information at the $N^{th}$ period. That is, the accumulated discharging current value indicates a sum of pieces of current information indicating a value greater than 0 in current information 410 at the $N^{th}$ period. The accumulated charging current value refers to an accumulated value of charging current information at the $N^{th}$ period. That is, the accumulated charging current value indicates a sum of pieces of current information indicating a value less than 0 in the current information 410 at the $N^{th}$ period. The accumulated charging current value is a negative number. The battery state estimating apparatus applies an absolute value to the accumulated charging current value. For example, the battery state estimating apparatus calculates the accumulated discharging current value based on Equation 5, and the accumulated charging current value based on Equation 6.

$$Coulomb\_counting_{discharge}=a$$

$$a^*=abs(a) \quad \text{[Equation 5]}$$

In Equation 5, a denotes an accumulated discharging current value, and abs( ) denotes an absolute value. Based on the accumulated discharging current value, the battery state estimating apparatus may or may not apply an absolute value to a.

$$Coulomb\_counting_{charge}=b$$

$$b^*=abs(b) \quad \text{[Equation 6]}$$

In Equation 6, b denotes an accumulated charging current value, and abs( ) denotes an absolute value.

The battery state estimating apparatus determines whether to correct the discharging current information or the charging current information based on a result of comparing a* with b*. That is, the battery state estimating apparatus determines current information to be corrected between the discharging current information and the charging current information based on the result of comparing a* with b*. The battery state estimating apparatus determines a correction value for the current information to be corrected, based on a ratio determined based on a* (or a) and b* and on a capacity error, Δcapacity_N, corresponding to a voltage error. The determining of the correction error will be described in more detail hereinafter.

In a case that a value of a* (or a) is greater than a value of b* (a*>b*, or a>b*), the battery state estimating apparatus corrects the discharging current information. In such a case, the battery state estimating apparatus determines a capacity error $Δcapacity_{discharge}$ of the discharging current information based on a ratio between a sum of the values of a* and b* (a*+b*) and the value of a*, or between a sum of the values of a and b* (a+b*) and the value of a and on capacity_N. The battery state estimating apparatus determines a correction value, I_correct$_{discharge}$, for the discharging current information based on the capacity error Δcapacity$_{discharge}$. For example, upon the value of a* being greater than the value of b* (a*>b*), the battery state estimating apparatus determines the correction value I_correct$_{discharge}$ based on Equation 7.

$$\Delta capacity_{discharge} = \Delta capacity\_N \times ((a^*+b^*)/a^*)$$

$$I\_correct_{discharge} = \Delta capacity_{discharge}/dt \quad \text{[Equation 7]}$$

In Equation 7, dt denotes a constant value. dt may be, for example, a length of the $N^{th}$ period. Based on an example, in Equation 7, ((a*+b*)/a*) may be replaced with (a*/(a*+b*)).

The battery state estimating apparatus corrects the discharging current information by adding I_correct$_{discharge}$ to the discharging current information. An example 420 of the corrected current information is illustrated in FIG. 4A. In the example 420, the discharging current information is shifted upwards by I_correct$_{discharge}$.

Upon the value of a* (or a) being less than the value of b* (a*<b*, or a<b*), the battery state estimating apparatus corrects the charging current information. In such an example, the battery state estimating apparatus determines a capacity error Δcapacity$_{charge}$ of the charging current information based on a ratio between a sum of the values of a* and b* (a*+b*) and the value of b*, or between a sum of the values of a and b* (a+b*) and the value of b* and on capacity_N. The battery state estimating apparatus determines a correction value I_correct$_{charge}$ for the charging current information based on the capacity error Δcapacity$_{charge}$. For example, in a case that the value of a* is greater than the value of b* (a*>b*), the battery state estimating apparatus determines the correction value I_correct$_{charge}$ based on Equation 8.

$$\Delta capacity_{charge} = \Delta capacity\_N \times ((a^*+b^*)/b^*)$$

$$I\_correct_{charge} = \Delta capacity_{charge}/dt \quad \text{[Equation 8]}$$

Based on an example, in Equation 8, ((a*+b*)/b*) may be replaced with (b*/(a*+b*)).

The battery state estimating apparatus corrects the charging current information by subtracting I_correct$_{charge}$ from the charging current information. An example 430 of the corrected current information is also illustrated in FIG. 4A. In the example 430, the charging current information is shifted downwards by I_correct$_{charge}$.

In an example in which the value of a* is equal to the value of b* (a*=b*), the battery state estimating apparatus randomly determines which one of the discharging current information and the charging current information is to be corrected.

Figure 4B:
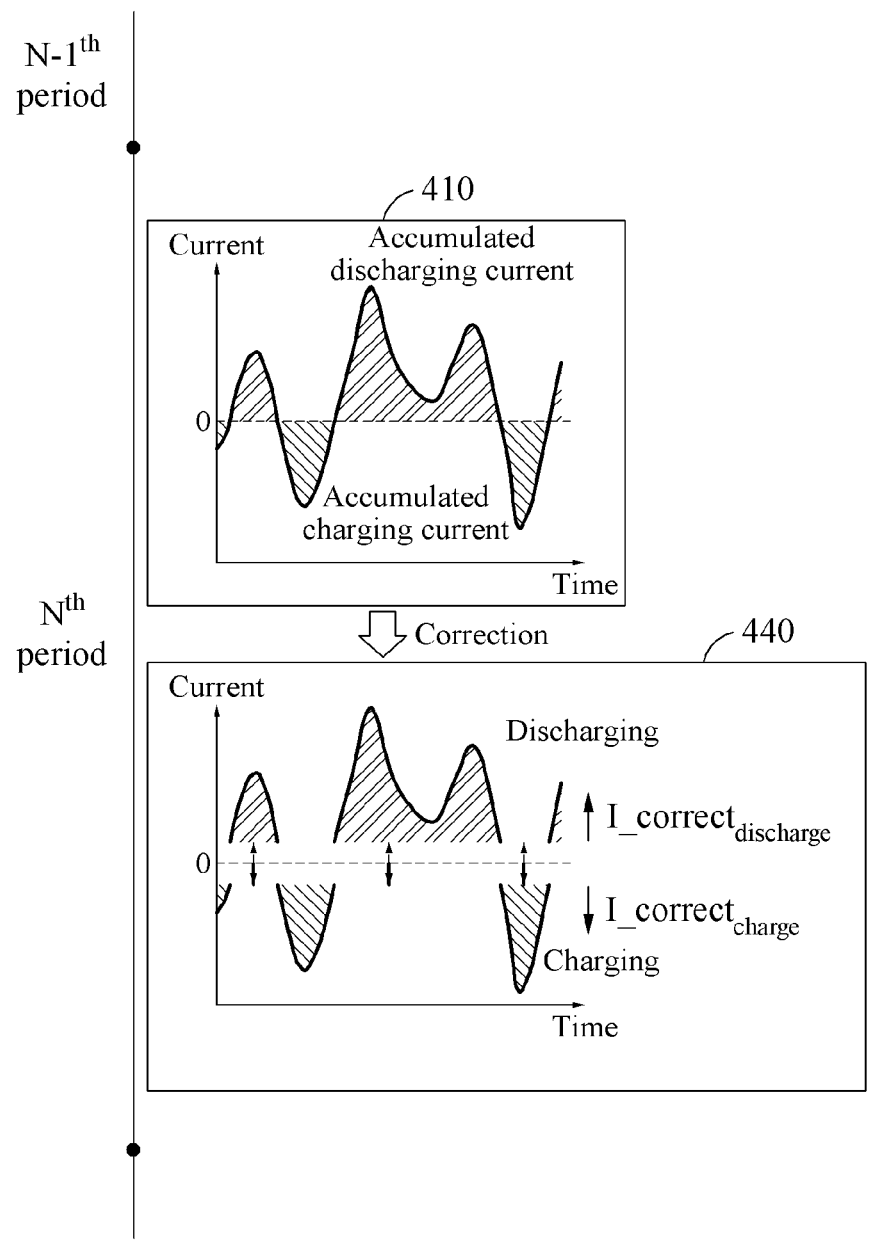

Referring to FIG. 4B, the battery state estimating apparatus determines both the charging current information and the discharging current information. In such an example, the battery state estimating apparatus determines a correction value for the discharging current information based further on a discharging correction ratio in addition to the ratio determined based on the value of a* (or a) and the value of b* and the value of capacity_N. In addition, the battery state estimating apparatus determines a correction value for the charging current information based on a charging correction ratio and the ratio determined based on the value of a* (or a) and the value of b* and the value of capacity_N. The determining of the correction value will be described in more detail hereinafter.

The battery state estimating apparatus determines the capacity error Δcapacity$_{discharge}$ of the discharging current information based on the ratio between a sum of the values of a* and b* (a*+b*) and the value of a*, or the ratio between the sum of the values of a and b* (a+b*) and the value of b*, the discharging correction ratio, and the value of capacity_N. The battery state estimating apparatus determines the correction value I_correct$_{discharge}$ for the discharging current information based on the determined capacity error Δcapacity$_{discharge}$. In addition, the battery state estimating apparatus determines the capacity error Δcapacity$_{charge}$ of the charging current information based on the ratio between the sum of the values of a* and b* (a*+b*) and the value of a*, or the ratio between the sum of the values of a and b* (a+b*) and the value of b*, the charging correction ratio, and the value of capacity_N. The battery state estimating apparatus determines the correction value I_correct$_{charge}$ for the charging current information based on the determined capacity error Δcapacity$_{charge}$. For example, the battery state estimating apparatus determines the correction value I_correct$_{discharge}$ based on Equation 9, and the correction value I_correct$_{charge}$ based on Equation 10.

$$\Delta capacity_{discharge} = \Delta capacity\_N \times x \times ((a^*+b^*)/a^*)$$

$$I\_correct_{discharge} = \Delta capacity_{discharge}/dt \quad \text{[Equation 9]}$$

$$\Delta capacity_{charge} = \Delta capacity\_N \times y \times ((a^*+b^*)/b^*)$$

$$I\_correct_{charge} = \Delta capacity_{charge}/dt \quad \text{[Equation 10]}$$

In Equation 9, x denotes a discharging correction ratio. In Equation 10, y denotes a charging correction ratio. For example, x=y=0.5. However, a value of x and y is not limited to the example, and the battery state estimating apparatus determines a value of x and y based on state information of a battery unit, for example, an SoC of the battery. For example, in response to the SoC being greater than or equal to 80% (SoC 80%), the battery state estimating apparatus determines the value of x to be 0.7 and the value of y to be 0.3 (x=0.7, y=0.3). In response to the SoC being greater than 20% and less than 80% (20%<SoC<80%), the battery state estimating apparatus determines the value of x to be 0.5 and the value of y to be 0.5 (x=0.5, y=0.5). In response to the SoC being less than or equal to 20% (SoC 20%), the battery state estimating apparatus determines the value of x to be 0.3 and the value of y to be 0.7 (x=0.3, y=0.7).

Based on an example, ((a*+b*)/a*) may be replaced with (a*/(a*+b*)) in Equation 9, and ((a*+b*)/b*) may be replaced with (b*/(a*+b*)) in Equation 10.

The battery state estimating apparatus adds, to the discharging current information, the correction value I_correct$_{discharge}$ to which the discharging correction ratio is applied and subtract, from the charging current information, the correction value I_correct$_{charge}$ to which the charging correction ratio is applied. Thus, the current information 410 from the current period is corrected. An example 440 of the corrected current information is illustrated in FIG. 4B. In the example 440, the discharging current information is shifted upwards by the correction value I_correct$_{discharge}$ to which the discharging correction ratio is applied, and the charging current information is shifted downwards by the correction value I_correct$_{charge}$ to which the charging correction ratio is applied.

Figure 5A:
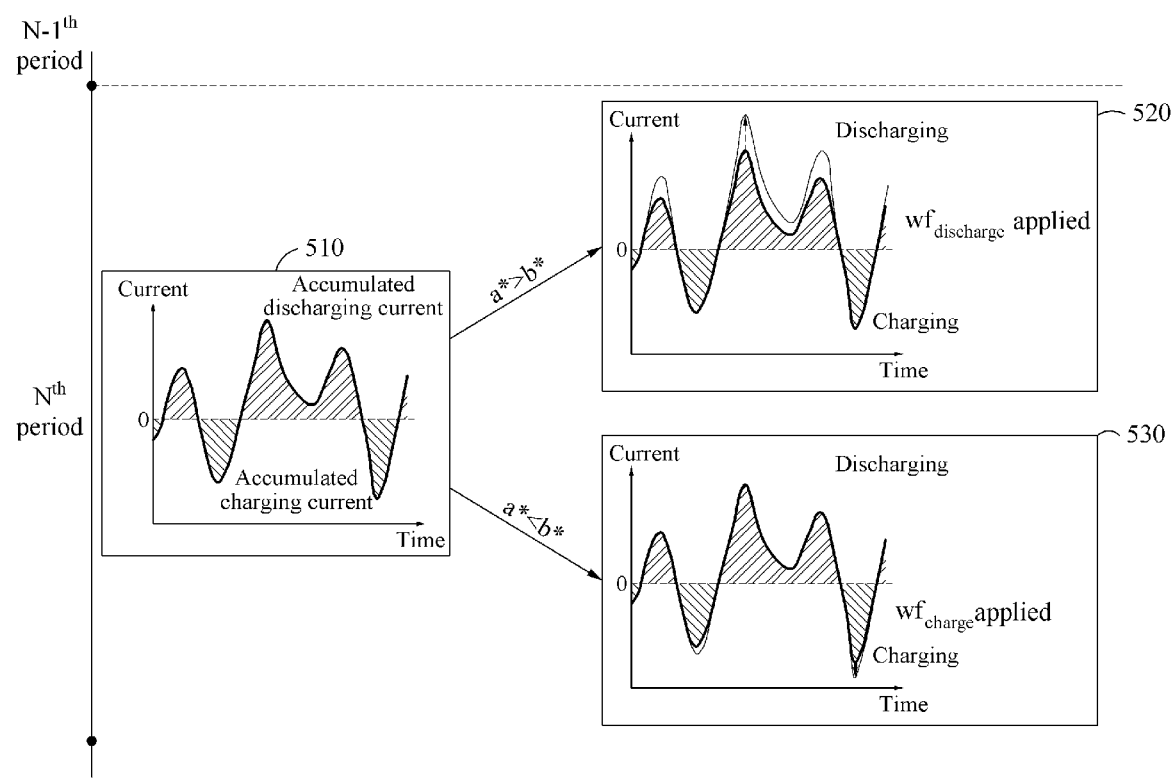

Referring to FIG. 5A, the battery state estimating apparatus calculates a value of a* and a value of b*. The calculating of the values of a* and b* is described with reference to FIG. 4A and, thus, a more detailed and repeated description will be omitted here for brevity.

The battery state estimating apparatus determines current information to be corrected between discharging current information and charging current information based on a result of comparing the value of a*, or a, and the value of b*. The battery state estimating apparatus determines a correction value for the current information to be corrected based on a ratio determined based on the value of a*, or a, and the value of b*, and on a value of Δcapacity_N. The determining of the correction value will be described in detail hereinafter.

In a case that the value of a* is greater than the value of b* (a*>b*), the battery state estimating apparatus determines the discharging current information to be the current information to be corrected, and determines a value of $\Delta capacity_{discharge}$. The value of $\Delta capacity_{discharge}$ is described with reference to Equation 7 and, thus, a more detailed and repeated description will be omitted here for brevity. When $\Delta capacity_{discharge}$ is determined, the battery state estimating apparatus determines a discharging weight factor to establish Equation 11.

$$\Delta Capacity_{discharge} = \int (I_{discharge} \times (wf_{discharge} - 1)) dt \quad \text{[Equation 11]}$$

In Equation 11, $I_{discharge}$ denotes discharging current information from a current period, for example, an $N^{th}$ period, and $wf_{discharge}$ denotes a discharging weight factor.

The discharging weight factor indicates a correction value for the discharging current information. The battery state estimating apparatus applies the discharging weight factor to the discharging current information. Thus, current information 510 from the current period is corrected. An example 520 of the corrected current information is illustrated in FIG. 5A.

In a case that the value of a* is less than the value of b* (a*<b*), the battery state estimating apparatus determines the charging current information to be the current information to be corrected. In such a case, the battery state estimating apparatus determines a value of $\Delta capacity_{charge}$. The value of $\Delta capacity_{charge}$ is described with reference to Equation 8 and, thus, a more detailed and repeated description will be omitted here for brevity. When the value of $\Delta capacity_{charge}$ is determined, the battery state estimating apparatus determines a charging weight factor to establish Equation 12.

$$\Delta Capacity_{charge} = \int (I_{charge} \times (wf_{charge} - 1)) dt \quad \text{[Equation 12]}$$

In Equation 12, $I_{charge}$ denotes charging current information from a current period, for example, an $N^{th}$ period, and $wf_{charge}$ denotes a charging weight factor.

The charging weight factor indicates a correction value for the charging current information. The battery state estimating apparatus corrects the current information 510 from the current period by applying the charging weight factor to the charging current information. An example 530 of the corrected current information is also illustrated in FIG. 5A.

In an example in which the values of a* and b* are equal to each other (a*=b*), the battery state estimating apparatus randomly determines which one of the discharging current information and the charging current information is to be corrected.

Figure 5B:
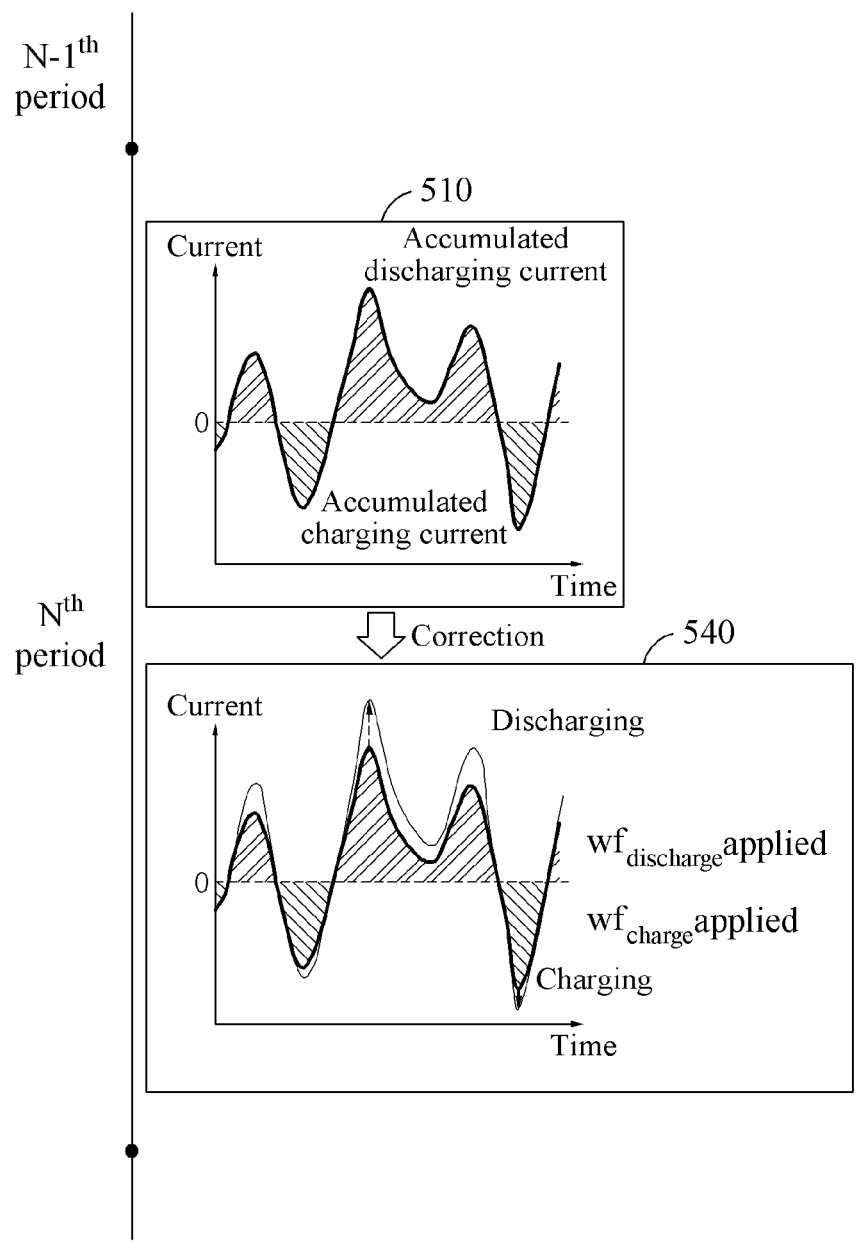

Referring to FIG. 5B, the battery state estimating apparatus corrects both discharging current information and charging current information. In such a case, the battery state estimating apparatus determines a capacity error of the discharging current information based on a discharging correction ratio, and a capacity error of the charging current information based on a charging correction ratio. For example, the battery state estimating apparatus determines a value of $\Delta capacity_{discharge}$ described with reference to Equation 9, and a value of $\Delta capacity_{charge}$ described with reference to Equation 10. When the value of $\Delta capacity_{discharge}$ is determined, the battery state estimating apparatus determines a discharging weight factor to establish Equation 11. When the value of $\Delta capacity_{charge}$ is determined, the battery state estimating apparatus determines a charging weight factor to establish Equation 12.

The battery state estimating apparatus applies the discharging weight factor to the discharging current information, and the charging weight factor to the charging current information. An example 540 of the corrected current information is illustrated in FIG. 5B.

Figure 6:
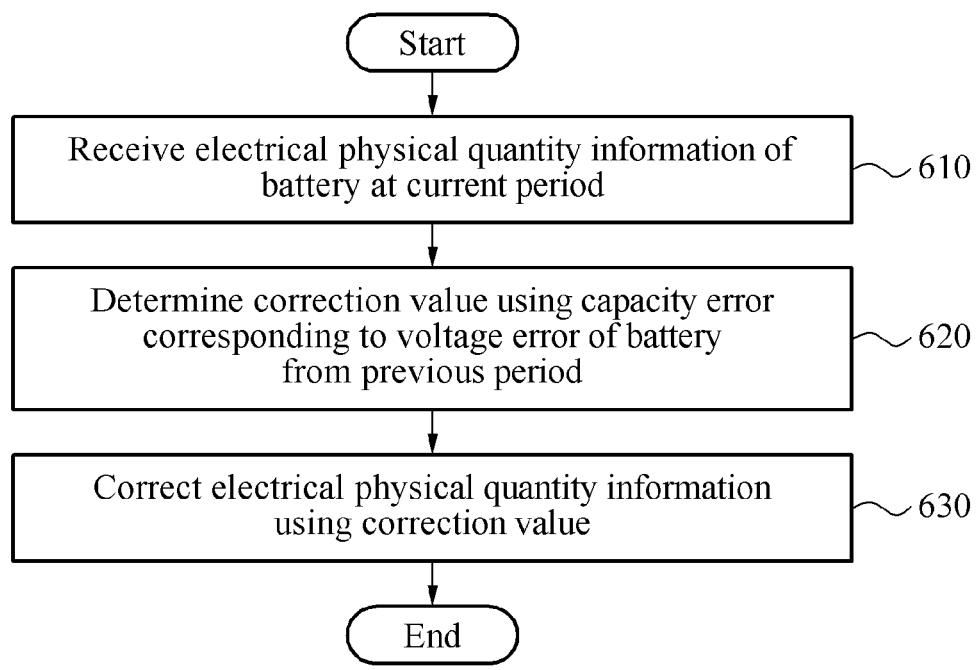
FIG. 6 is a flowchart illustrating an example of a method to correct an error in state information of a battery.

FIG. 6 is a flowchart illustrating an example of a method to correct an error in state information of a battery. The method to correct an error in state information of a battery is hereinafter simply referred to as a battery state information error correcting method.

The battery state information error correcting method to be described hereinafter may be performed by a battery state estimating apparatus.

Referring to FIG. 6, in operation 610, the battery state estimating apparatus receives electrical physical quantity information of a battery at a current period.

In operation 620, the battery state estimating apparatus determines a correction value using a capacity error corresponding to a voltage error of the battery from a previous period.

In operation 630, the battery state estimating apparatus corrects the electrical physical quantity information from the current period using the determined correction value.

The descriptions provided with reference to FIGS. 1 through 5B may be applicable to the descriptions provided with reference to FIG. 6, and thus a more detailed and repeated description is omitted here for brevity.

Figure 7:
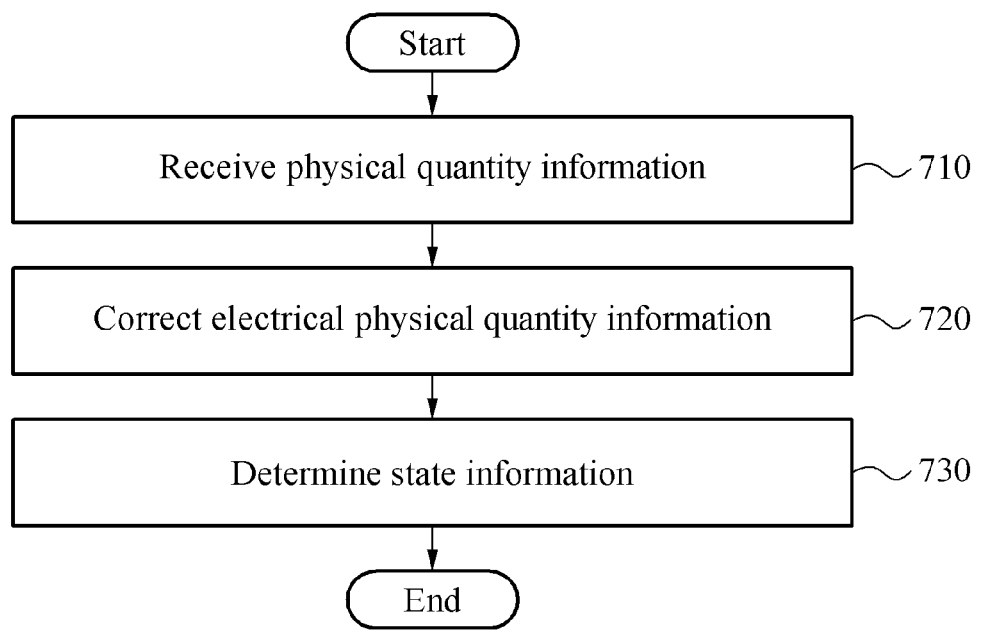
FIG. 7 is a flowchart illustrating an example of a method to estimate a state of a battery.

FIG. 7 is a flowchart illustrating an example of a method to estimate a state of a battery. The method of estimating a state of a battery is hereinafter simply referred to as a battery state estimating method.

The battery state estimating method to be described hereinafter is performed by a battery state estimating apparatus.

Referring to FIG. 7, in operation 710, the battery state estimating apparatus receives physical quantity information of a battery from a current period. The physical quantity information includes, for example, one of current information, voltage information, and temperature information, or a combination thereof.

In operation 720, the battery state estimating apparatus corrects electrical physical quantity information in the physical quantity information using a correction value determined based on a voltage error of the battery from a previous period. As described with reference to FIG. 2, the correction value is determined in the previous period. In addition, as described with reference to FIG. 3, the correction value is determined in the current period.

In operation 730, the battery state estimating apparatus determines state information of the battery based on the corrected electrical physical quantity information. For example, the battery state estimating apparatus determines the state information of the battery from the current period based on corrected current information. In addition, the battery state estimating apparatus determines the state information of the battery from the current period based on at least one of temperature information or voltage information, and the corrected current information.

In one example, the battery state estimating apparatus corrects physical quantity information to be input to a battery model, instead of correcting a parameter in the battery model. Thus, a state of the battery is estimated based on the corrected physical quantity information, without a structural change of the battery model, and a great increase in complexity of the battery model and/or in an amount of calculation to be processed. Thus, accuracy in the estimation is significantly improved. In addition, in an example in which an electrochemical model is used as the battery model, information on an internal state of the battery, for example, a cathode potential and a lithium ion concentration, may be retained without a loss.

The descriptions provided with reference to FIGS. 1 through 6 may be applicable to the descriptions provided with reference to FIG. 7 and, thus, a more detailed and repeated description is omitted here for brevity.

Figure 8:
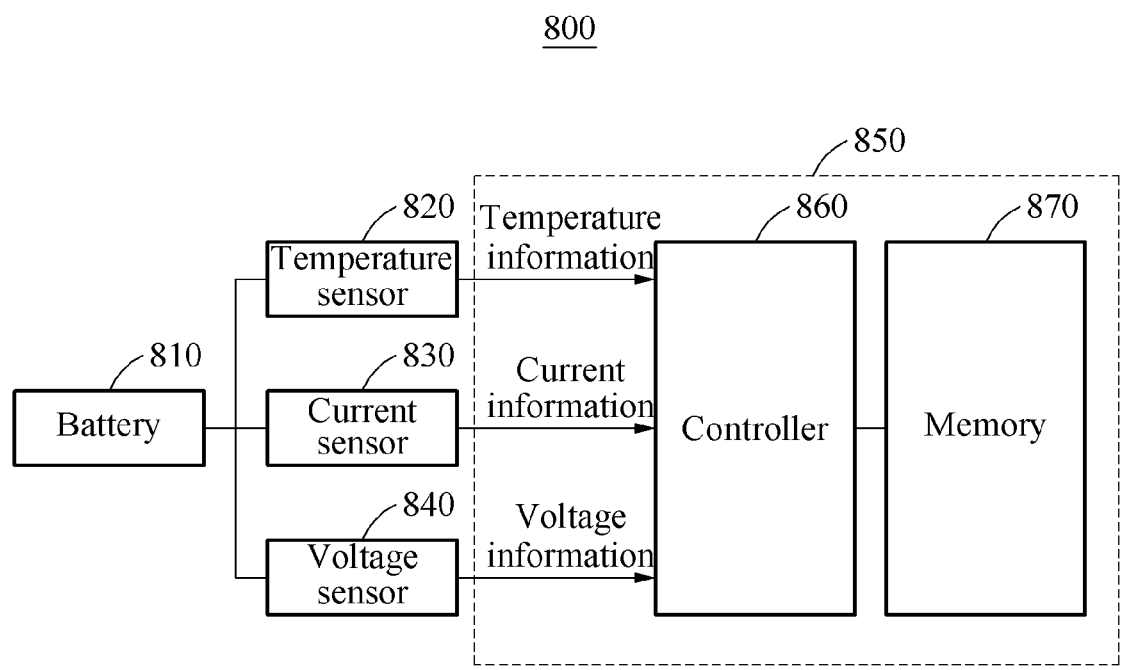
FIG. 8 is a diagram illustrating an example of a battery system.

FIG. 8 is a diagram illustrating an example of a battery system.

Referring to FIG. 8, a battery system 800 includes a battery 810, a sensing system including, for example, a temperature sensor 820, a current sensor 830, or a voltage sensor 840, and a battery state estimating apparatus 850.

Although the sensing system is illustrated as being disposed, located, or positioned outside the battery state estimating apparatus 850, the sensing system may also be disposed, located, or positioned inside the battery state estimating apparatus 850.

The battery state estimating apparatus 850 includes a controller 860 and a memory 870.

The controller 860 receives physical quantity information of the battery 810 from a current period. For example, the controller 860 receives the physical quantity information of the battery 810 from the sensing system. That is, the controller 860 collects the physical quantity information of the battery 810 using the sensing system.

The controller 860 corrects electrical physical quantity information of the battery 810 using a correction value determined based on a voltage error of the battery 810 from a previous period.

The controller 860 determines state information of the battery 810 based on the corrected electrical physical quantity information.

The memory 870 stores at least one instruction associated with an operation of the controller 860. When the instruction is implemented or executed, the controller 860 executes or performs the operation.

The descriptions provided with reference to FIGS. 1 through 7 may be applicable to the descriptions provided with reference to FIG. 8 and, thus, a more detailed and repeated description is omitted here for brevity.

Figure 9:
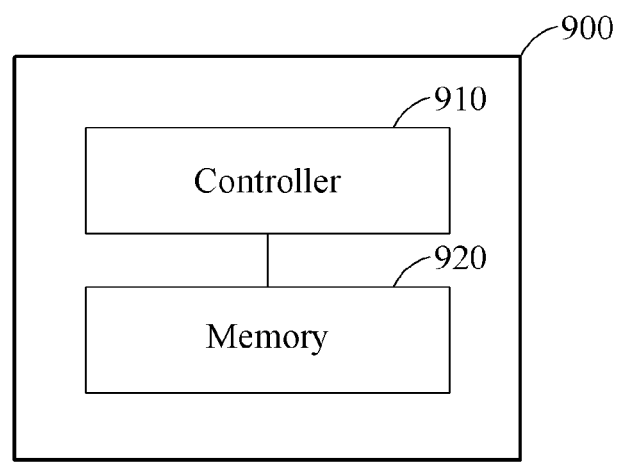
FIG. 9 is a diagram illustrating an example of an apparatus to estimate a state of a battery.

FIG. 9 is a diagram illustrating an example of a battery state estimating apparatus.

Referring to FIG. 9, a battery state estimating apparatus 900 includes a controller 910 and a memory 920.

The controller 910 receives electrical physical quantity information of a battery at a current period.

The controller 910 determines a correction value using a capacity error corresponding to a voltage error of the battery from a previous period.

The controller 910 corrects the electrical physical quantity information using the determined correction value.

The memory 920 stores at least one instruction associated with an operation of the controller 910. When the instruction is implemented, the controller 910 performs or executes the operation.

The descriptions provided with reference to FIGS. 1 through 8 may be applicable to the descriptions provided with reference to FIG. 9, and thus a more detailed and repeated description is omitted here for brevity.

Figure 10:
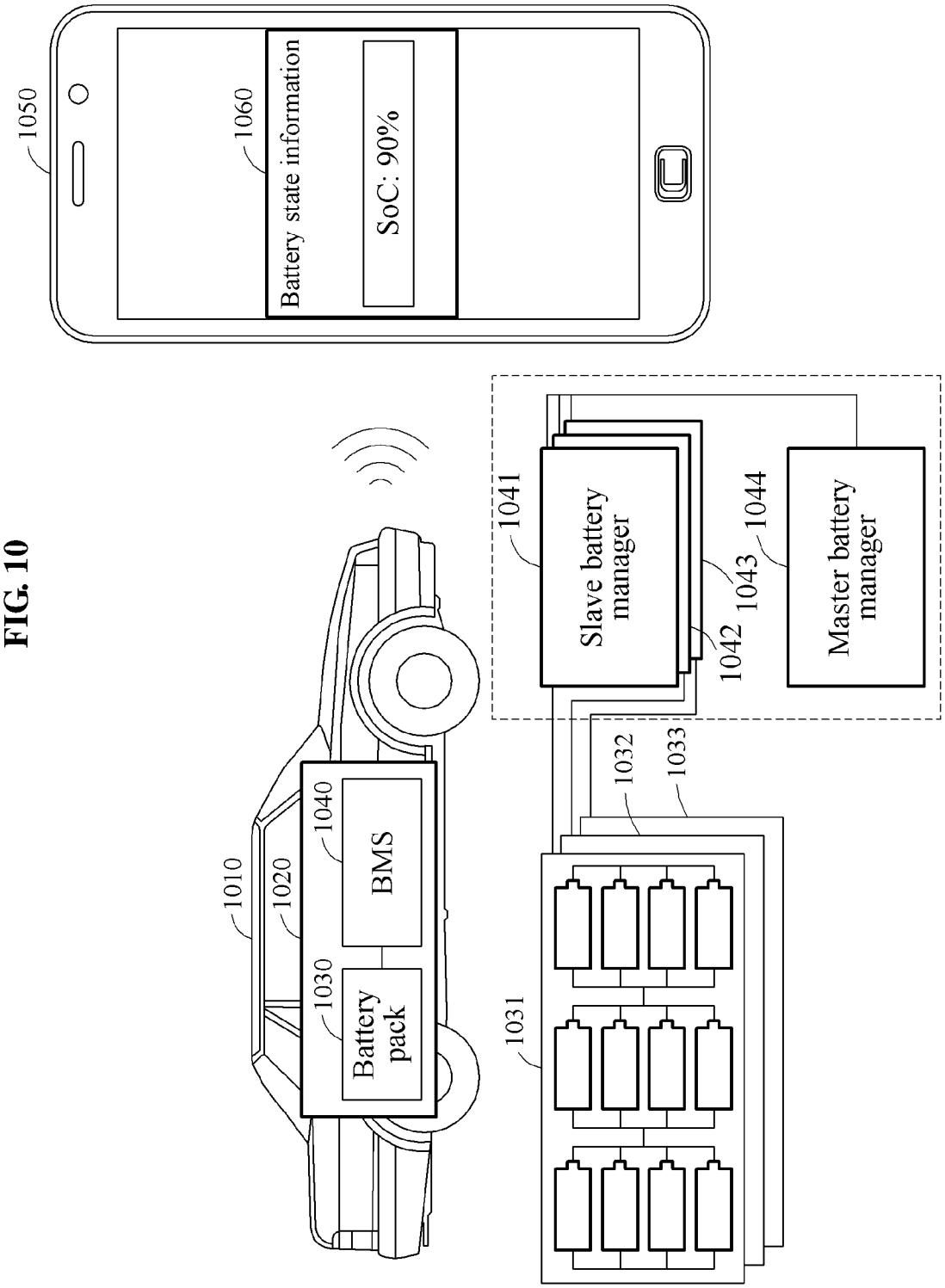
FIG. 10 is a diagram illustrating an example of provide state information.

FIG. 10 is a diagram illustrating an example of provision of state information.

FIG. 10 illustrates a vehicle 1010. The vehicle 1010 may be an electric vehicle or a hybrid vehicle.

Referring to FIG. 10, a battery system 1020 includes a battery pack 1030 and a battery management system (BMS) 1040. Dissimilar to the example illustrated in FIG. 10, the BMS 1040 is included in the battery pack 1030.

The battery pack 1030 includes a plurality of battery modules, for example, a battery module 1031, a battery module 1032, and a battery module 1033. Each of the battery modules 1031, 1032, and 1033 may include a plurality of battery cells.

The BMS 1040 includes a master battery manager 1044 and a plurality of slave battery managers, for example, a slave battery manager 1041, a slave battery manager 1042, and a slave battery manager 1043.

Each of the slave battery managers 1041, 1042, and 1043 may include a battery state estimating apparatus (not shown) described herein. That is, the slave battery managers 1041, 1042, and 1043 execute a method of correcting an error in state information of a battery and/or a battery state estimating method that are described herein.

Based on an example, the master battery manager 1044 includes the battery state estimating apparatus. That is, the master battery manager 1044 executes the method of correcting an error in state information of a battery and/or the battery state estimating method.

The BMS 1040 is included in a mass BMS, for example, an energy storage system (ESS). In addition, the BMS 1040 is included in an electronic device or a device management system including a rechargeable battery.

The descriptions provided with reference to FIGS. 1 through 9 may be applicable to the descriptions provided with reference to FIG. 10 and, thus, a more detailed and repeated description is omitted here for brevity.

Figure 11:
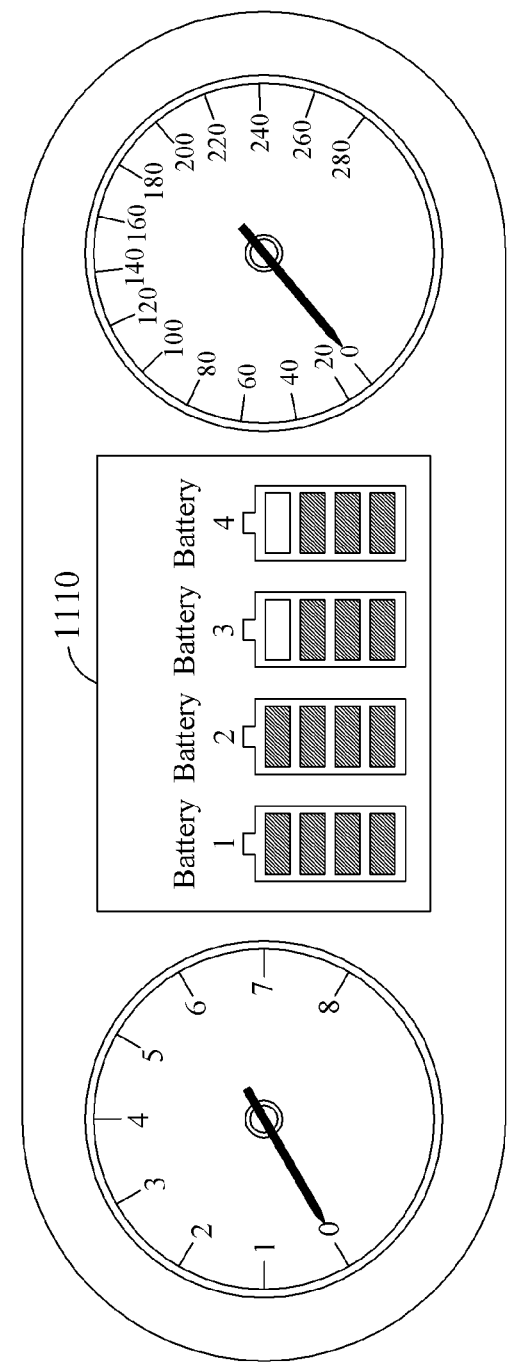
FIG. 11 is a diagram illustrating another example provide state information.

FIG. 11 is a diagram illustrating another example of provision of state information.

Referring to FIG. 11, state information 1110 of each of a plurality of battery units is output to be displayed on a dashboard. In one illustrative example, a battery is a battery cell or a battery module. In addition, although not illustrated in FIG. 11, state information of a battery pack may be output to be displayed on the dashboard.

A BMS transmits the state information 1110 to an electronic control unit (ECU), and the ECU outputs the state information 1110 to the display of the dashboard.

The descriptions provided with reference to FIGS. 1 through 10 may be applicable to the descriptions provided with reference to FIG. 11 and, thus, a more detailed and repeated description is omitted here for brevity.

The apparatuses, models, modules, devices, and other components illustrated in FIGS. 8, 9, and 10 that perform the operations described herein with respect to FIGS. 1, 2, 3, 4A and 4B, 5A and 5B, 6, and 7 are implemented by hardware components. Examples of hardware components include controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1, 2, 3, 4A and 4B, 5A and 5B, 6, and 7. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method to estimate a state of a battery, the method comprising:
    correcting electrical physical quantity information of the battery at a current time period using a correction value determined based on a voltage error of the battery from a previous time period; and
    determining state information of the battery based on the corrected electrical physical quantity information,
    wherein the voltage error is determined based on a difference between estimated voltage information of the battery from the previous time period and sensed voltage information of the battery from the previous time period.

2. The method of claim 1, further comprising:
    determining the correction value using the voltage error and a capacity error determined based on estimated open-circuit voltage (OCV) information of the battery from the previous time period.

3. The method of claim 2, wherein the determining of the correction value comprises:
    applying a weight to the capacity error; and
    determining, to be the correction value, a value obtained by dividing the capacity error to which the weight is applied by a constant value.

4. The method of claim 2, wherein the weight is determined based on an average current value calculated based on either one or both of current information at the current time period and current information from the previous time period.

5. The method of claim 2, wherein the capacity error is determined using a difference between first state information corresponding to a first OCV, which is obtained by subtracting a partial value of the voltage error from the estimated OCV information, and second state information corresponding to a second OCV, which is obtained by adding a remainder value of the voltage error to the estimated OCV information.

6. The method of claim 1, further comprising:
determining either one or both of a correction value to be used to correct discharging current information at the current time period and a correction value to be used to correct charging current information at the current time period based on an accumulated value of the discharging current information, an accumulated value of the charging current information, and a capacity error corresponding to the voltage error.

7. The method of claim 1, further comprising:
calculating an accumulated discharging current value and an accumulated charging current value based on current information at the current time period;
determining current information to be corrected between discharging current information and charging current information by comparing the accumulated discharging current value and an absolute value of the accumulated charging current value; and
determining a correction value for the determined current information, based on a ratio of the accumulated discharging current value and the absolute value of the accumulated charging current value, and on a capacity error corresponding to the voltage error.

8. The method of claim 1, further comprising:
calculating an accumulated discharging current value and an accumulated charging current value based on current information at the current time period;
determining a correction value to discharge current information at the current time period, based on a ratio of the accumulated discharging current value and an absolute value of the accumulated charging current value, a capacity error corresponding to the voltage error, and a discharging correction ratio; and
determining a correction value to charge current information at the current time period based on the ratio, the capacity error, and a charging correction ratio.

9. A non-transitory computer-readable storage medium storing instructions that, when executed by a processor, cause the processor to perform the method of claim 1.

10. A method to correct an error in state information of a battery, the method comprising:
receiving electrical physical quantity information of the battery at a current time period;
determining a correction value using a capacity error corresponding to a voltage error of the battery from a previous time period; and
correcting the electrical physical quantity information using the determined correction value,
wherein the voltage error is determined based on a difference between estimated voltage information of the battery from the previous time period and sensed voltage information of the battery from the previous time period.

11. The method of claim 10, wherein the voltage error is a difference between estimated voltage information of the battery from the previous time period and sensed voltage information of the battery from the previous time period.

12. The method of claim 10, wherein the capacity error is determined based on the voltage error and estimated open-circuit voltage (OCV) information of the battery from the previous time period.

13. The method of claim 10, wherein the capacity error is determined using a difference between first state information corresponding to a first OCV, which is obtained by subtracting a partial value of the voltage error from the estimated OCV information from the previous time period, and second state information corresponding to a second OCV, which is obtained by adding a remainder value of the voltage error to the estimated OCV information.

14. The method of claim 10, wherein the determining of the correction value comprises:
adding a weight to the capacity error; and
determining, to be the correction value, a value obtained by dividing the capacity error to which the weight is added by a constant value.

15. The method of claim 14, wherein the weight is determined based on an average current value calculated based on either one or both of current information at the current time period and current information from the previous time period.

16. The method of claim 10, wherein the determining of the correction value comprises:
determining either one or both of a correction value to be used to correct discharging current information at the current time period and a correction value to be used to correct charging current information at the current time period based on an accumulated value of the discharging current information, an accumulated value of the charging current information, and the capacity error corresponding to the voltage error.

17. The method of claim 10, wherein the determining of the correction value comprises:
calculating an accumulated discharging current value and an accumulated charging current value based on current information at the current time period;
determining current information to be corrected between discharging current information and charging current information by comparing the accumulated discharging current value and an absolute value of the accumulated charging current value; and
determining a correction value for the determined current information based on a ratio of the accumulated discharging current value and the absolute value of the accumulated charging current value and on the capacity error.

18. The method of claim 10, wherein the determining of the correction value comprises:
calculating an accumulated discharging current value and an accumulated charging current value based on current information at the current time period;
determining a correction value for discharging current information at the current time period based on a ratio of the accumulated discharging current value and an absolute value of the accumulated charging current value, the capacity error, and a discharging correction ratio; and
determining a correction value for charging current information at the current time period based on the ratio, the capacity error, and a charging correction ratio.

19. An apparatus to estimate a state of a battery, the apparatus comprising:
a controller configured to correct electrical physical quantity information of the battery at a current time period using a correction value determined based on a voltage error of the battery from a previous time period, and determine state information of the battery based on the corrected electrical physical quantity information; and
a memory configured to store instructions associated with an operation of the controller,
wherein the voltage error is determined based on a difference between estimated voltage information of the battery from the previous time period and sensed voltage information of the battery from the previous time period.

20. The apparatus of claim 19, wherein the controller is configured to determine the correction value using the voltage error and a capacity error determined based on estimated open-circuit voltage (OCV) information of the battery from the previous time period.

21. The apparatus of claim 20, wherein the controller is configured to apply a weight to the capacity error and determine, to be the correction value, a value obtained by dividing the capacity error to which the weight is added by a time value corresponding to the current time period.

22. The apparatus of claim 20, wherein the capacity error is determined using a difference between first state information corresponding to a first OCV obtained by subtracting a partial value of the voltage error from the estimated OCV information, and second state information corresponding to a second OCV obtained by adding a remainder value of the voltage error to the estimated OCV information.

\* \* \* \* \*